(12) United States Patent
Lin et al.

(10) Patent No.: US 8,093,630 B2
(45) Date of Patent: Jan. 10, 2012

(54) SEMICONDUCTOR DEVICE AND LATERAL DIFFUSED METAL-OXIDE-SEMICONDUCTOR TRANSISTOR

(75) Inventors: Jimmy Lin, Hsinchu (TW); Shang-Hui Tu, Tainan (TW); Ming-Horng Hsiao, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 385 days.

(21) Appl. No.: 12/477,054

(22) Filed: Jun. 2, 2009

(65) Prior Publication Data

US 2010/0301388 A1 Dec. 2, 2010

(51) Int. Cl.
*H01L 27/088* (2006.01)
(52) U.S. Cl. .... 257/224; 257/401; 257/403; 257/E21.05
(58) Field of Classification Search .......... None
See application file for complete search history.

(56) References Cited

U.S. PATENT DOCUMENTS

| | | | | |
|---|---|---|---|---|
| 6,498,373 | B1 * | 12/2002 | Vashchenko et al. | 257/360 |
| 7,808,047 | B1 * | 10/2010 | Gallerano et al. | 257/355 |
| 2005/0180073 | A1 * | 8/2005 | Armer et al. | 361/56 |
| 2005/0212063 | A1 * | 9/2005 | Nakano et al. | 257/401 |

* cited by examiner

*Primary Examiner* — Evan Pert
*Assistant Examiner* — Scott R Wilson

(57) ABSTRACT

The invention provides a semiconductor device and a lateral diffused metal-oxide-semiconductor transistor. The semiconductor device includes a substrate having a first conductive type. A gate is disposed on the substrate. A source doped region is formed in the substrate, neighboring with a first side of the gate, wherein the source doped region has a second conductive type different from the first conductive type. A drain doped region is formed in the substrate, neighboring with a second side opposite to the first side of the gate. The drain doped region is constructed by a plurality of first doped regions with the first conductive type and a plurality of second doped regions with the second conductive type, wherein the first doped regions and the second doped regions are alternatively arranged.

27 Claims, 5 Drawing Sheets

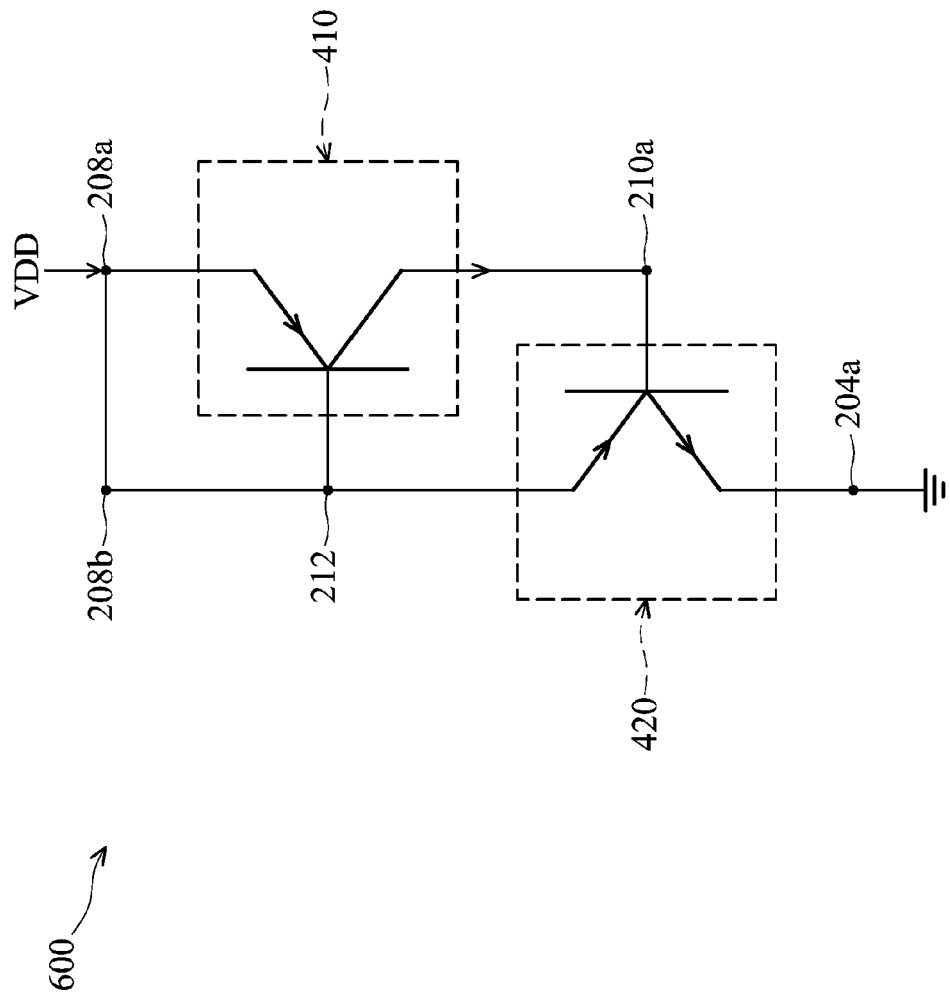

US 8,093,630 B2

SEMICONDUCTOR DEVICE AND LATERAL DIFFUSED METAL-OXIDE-SEMICONDUCTOR TRANSISTOR

BACKGROUND OF THE INVENTION

1. Field of the Invention

The present invention relates to a semiconductor device, and in particular, to a lateral diffused metal-oxide-semiconductor transistor (LDMOS) integrated with a silicon controlled rectifier (SCR).

2. Description of the Related Art

Improving semiconductor device reliability has become technically challenging, due to further scaling of the semiconductor device and demand for smaller dimensions and increased functions of consumer products. Semiconductor devices, however, may suffer from electrostatic discharge (ESD) damage when fabricated, assembled, delivered, tested or applied. Thus, ESD protection technology is required for semiconductor devices to prevent against possible ESD damage and insure quality thereof. Currently, the endurance voltage of the ESD protection device is required to be higher than 8 kV. In conventional ESD protection methods, a silicon controlled rectifier (SCR) is used as the ESD protection device to improve endurance voltage and economize chip area. However, if the SCR has an overly low holding voltage, the SCR may be triggered in the normal operation voltage and the semiconductor devices may be damaged due to a latch-up phenomenon.

Thus, a novel semiconductor device having an ESD protection device with a tunable holding voltage is desired.

BRIEF SUMMARY OF INVENTION

To solve the above-described problem, a semiconductor device and lateral diffused metal-oxide-semiconductor transistor are provided. An exemplary embodiment of a semiconductor device, comprises a substrate having a first conductive type. A gate is disposed on the substrate. A source doped region is formed in the substrate, neighboring with a first side of the gate, wherein the source doped region has a second conductive type different from the first conductive type. A drain doped region is formed in the substrate, neighboring with a second side opposite to the first side of the gate, wherein the drain doped region is constructed by a plurality of first doped regions with the first conductive type and a plurality of second doped regions with the second conductive type.

Another exemplary embodiment of a lateral diffused metal-oxide-semiconductor transistor (LDMOS), comprising a P-type substrate is provided. A gate is disposed on the P-type substrate. A source doped region is formed in the P-type substrate, neighboring with a first side of the gate. A drain doped region is formed in the P-type substrate, neighboring with a second side opposite to the first side of the gate, wherein the drain doped region is constructed by a plurality of P-type doped regions and a plurality of N-type doped regions.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIG. 4 is an equivalent circuit diagram of one exemplary embodiment of the semiconductor device of the invention.

Figure 1:
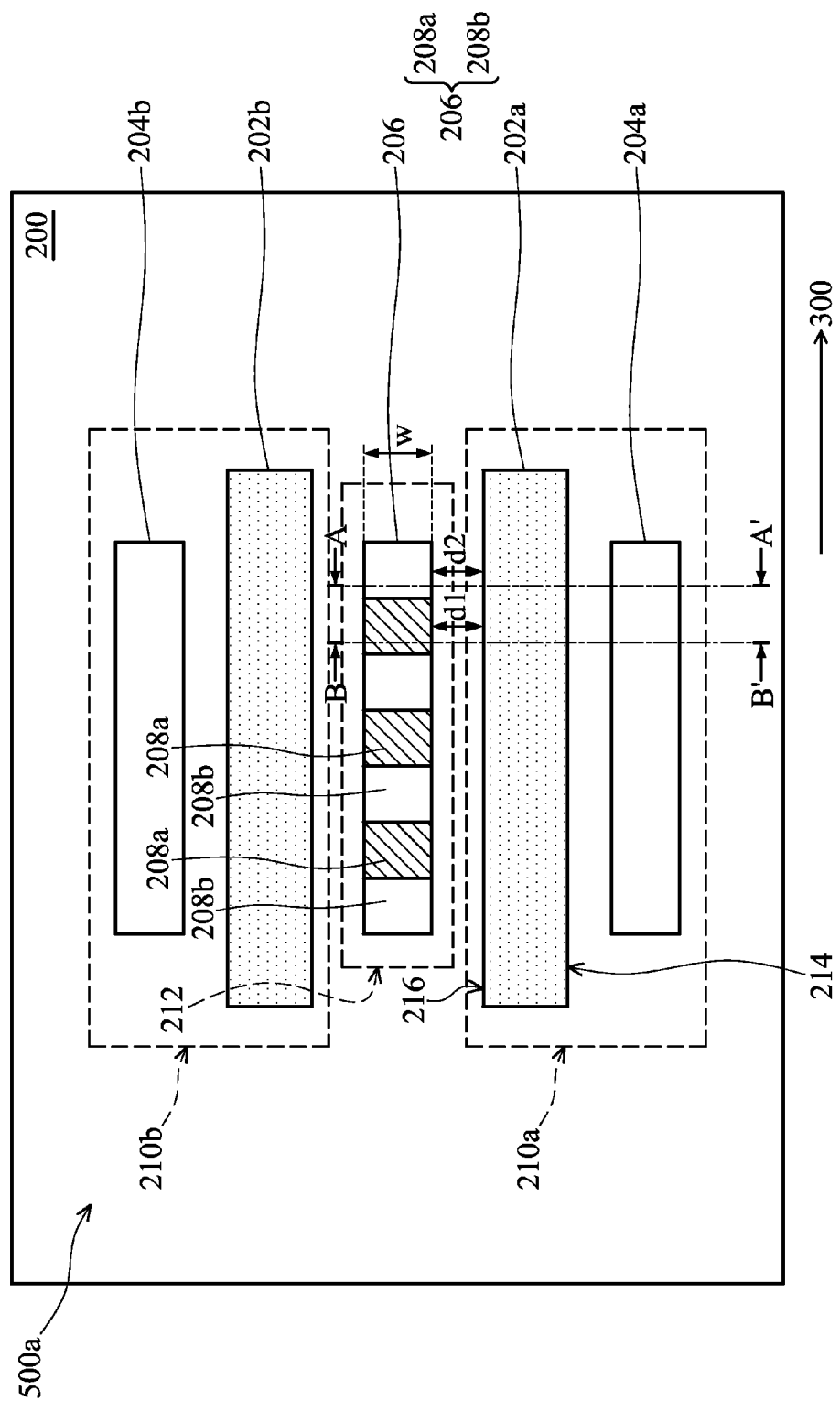
FIG. 1 is a top view showing one exemplary embodiment of the semiconductor device of the invention.

Table. 1 is an endurance voltage test result of N-type LDMOS transistors (threshold voltage (Vt): 200V; channel length (L): 0.9 µm; channel width (W): 500 µm) having P-type first doped regions in different areas according to embodiments of the invention and the conventional N-type LDMOS transistor (threshold voltage (Vt): 200V; channel length (L): 0.9 µm; channel width (W): 500 µm) without P-type first doped regions in human body mode (HBM).

DETAILED DESCRIPTION OF INVENTION

The following description is of a mode for carrying out the invention. This description is made for the purpose of illustrating the general principles of the invention and should not be taken in a limiting sense. The scope of the invention is best determined by reference to the appended claims. Wherever possible, a community reference numbers are used in the drawings and the descriptions to refer a community or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice of the invention.

Figure 2A:
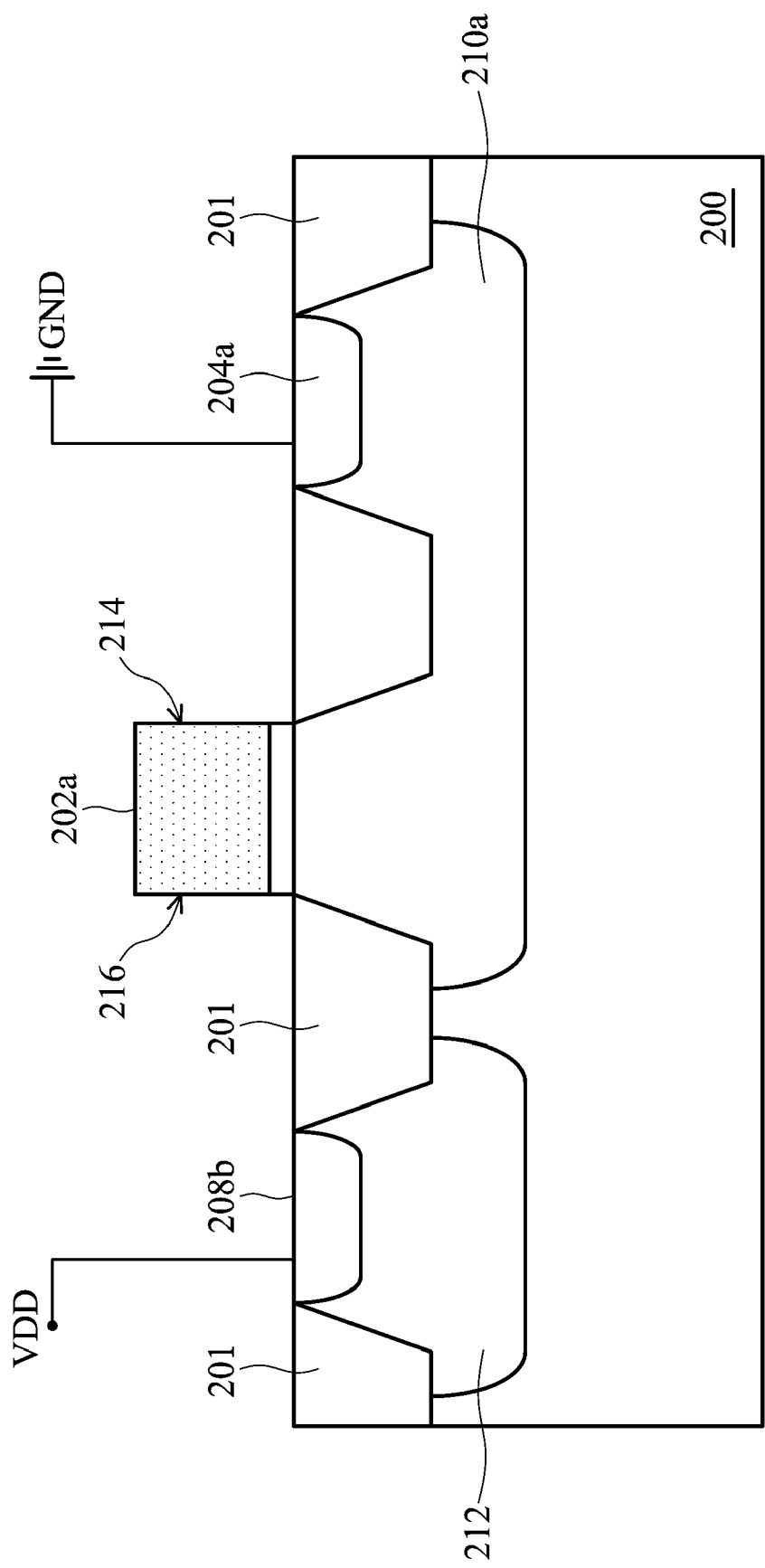
FIG. 2a is a cross section view along line A-A' of FIG. 1.
Figure 2B:
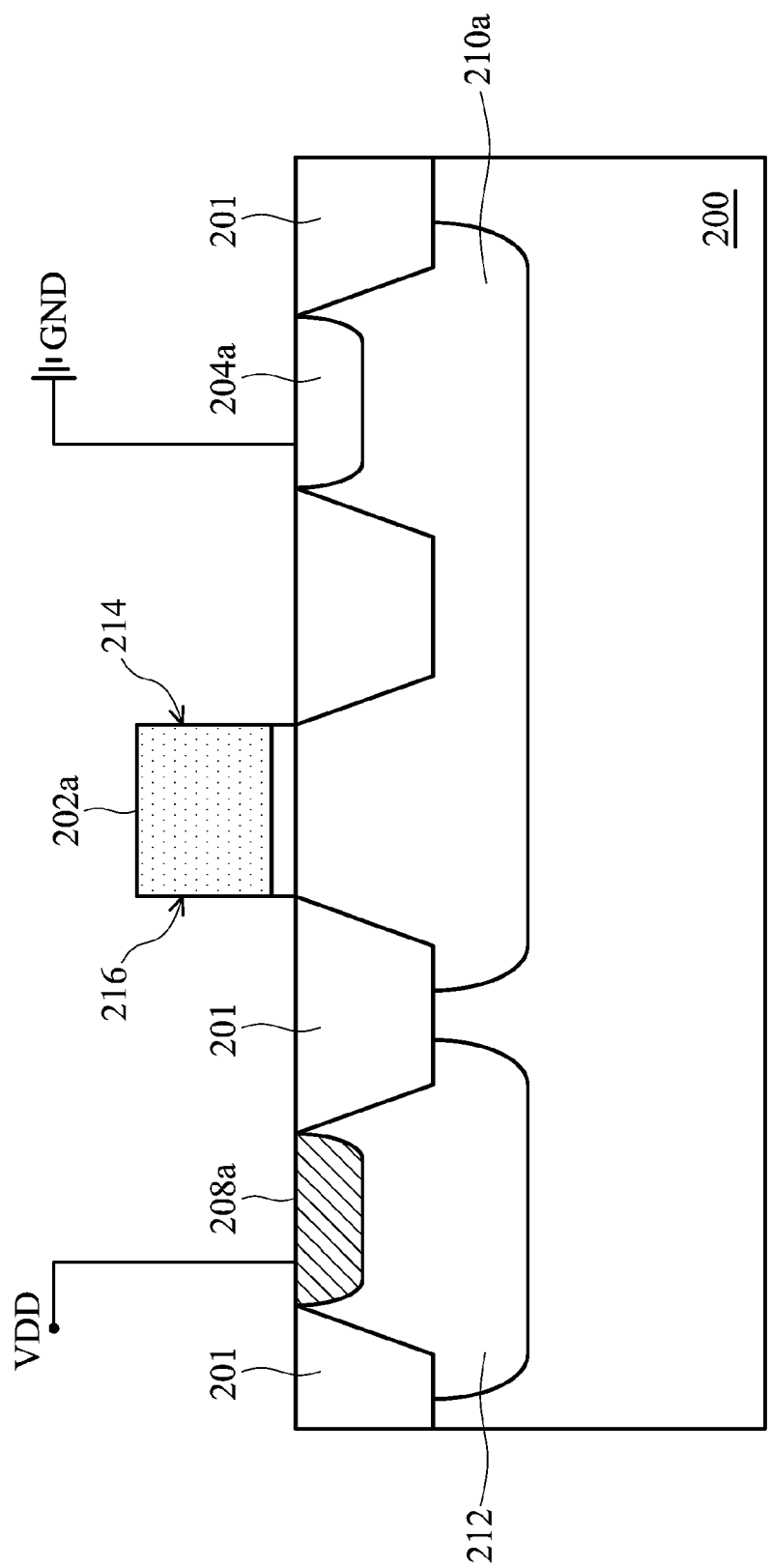
FIG. 2b is a cross section view along line B-B' of FIG. 1.

FIG. 1 is a top view showing one exemplary embodiment of the semiconductor device of the invention. FIG. 2a is a cross section view along line A-A' of FIG. 1. FIG. 2b is a cross section view along line B-B' of FIG. 1. As shown in FIG. 1, one exemplary embodiment of the semiconductor device 500a comprises two symmetrical lateral diffused metal-oxide-semiconductor transistors (LDMOS), which are parallel with each other and with a common-drain doped region. The amount of transistors is not limited, and may be according to design. The semiconductor device 500a may comprise a substrate 200, gates 202a and 202b, source doped regions 204a and 204b and a common-drain doped region 206, wherein the gates 202a and 202b, the source doped regions 204a and 204b and the drain doped region 206 are stripe-shaped. The gates 202a and 202b, the source doped regions 204a and 204b and the drain doped region 206 are parallel with each other. As shown in FIGS. 2a and 2b, the gate 202a and the source doped region 204a and the drain doped region 206 are separated by shallow trench isolation features 201. In one embodiment, the drain doped region 206 may be coupled to a voltage power supply terminal VDD, and the source doped region 204a may be coupled to a ground terminal GND.

In one embodiment, the substrate 200 may comprise silicon. In alternative embodiments, SiGe, bulk semiconductor, strained semiconductor, compound semiconductor, silicon on insulator (SOI), and other commonly used semiconductor substrates can be used for the substrate 200. The substrate 200 may have a desired conductive type by implanting P-type or N-type dopants. In one embodiment, the substrate 200 may be a P-type substrate, and the semiconductor device 500a may be an N-type LDMOS.

As shown in FIG. 1, the gates 202a and 202b are disposed on the semiconductor device 500a. In one embodiment, the gates 202a and 202b may be construct by a lower gate insulating layer and an upper gate layer, wherein the gate insulating layer may comprise commonly used dielectric materials, for example, oxide, nitride, oxynitride, oxycarbide or combinations thereof. Also, the gate insulating layer may comprise high-k (k>8) dielectric materials, for example, aluminum oxide ($Al_2O_3$), hafnium oxide ($HfO_2$), hafnium oxynitride (HfON), hafnium silicate ($HfSiO_4$), zirconium oxide ($ZrO_2$), zirconium oxynitride (ZrON), zirconium silicate ($ZrSiO_4$), yttrium oxide ($Y_2O_3$), lanthalum oxide ($La_2O_3$), cerium oxide ($CeO_2$), titanium oxide ($TiO_2$), tantalum oxide ($Ta_2O_5$) or combinations thereof. The gate layer may comprise silicon or polysilicon materials. The gate layer may be doped to reduce sheet resistance. Alternatively, the gate layer may comprise amorphous silicon.

As shown in FIG. 1, in one embodiment, the source doped regions 204a and 204b are formed in the substrate 200, respectively neighboring with a side of the gate 202a and 202b. For example, the source doped region 204a neighbors with a side 214 of the gate 202a. In one embodiment, the conductive type of the source doped regions 204a and 204b is different from that of the substrate 200. For example, if the conductive type of the substrate 200 is P-type, the conductive type of the source doped regions 204a and 204b is N-type. Additionally, the drain doped region 206 is formed in the substrate 200, serving as a common-drain doped region of the two LDMOS transistors. As shown in FIG. 1, the drain doped region 206 respectively neighbors with opposite sides of the gate 202a and 202b to the sides of the source doped regions 204a and 204b. For example, the drain doped region 206 neighbors with a side 216 opposite to the side 214. In one embodiment, the drain doped region 206 is constructed by a plurality of the first doped regions 208a and a plurality of the second doped regions 208b, wherein the first doped regions 208a and the second doped regions 208b are alternatively arranged along a longitudinal axis direction 300 of the drain doped region 206. As shown in FIG. 1, a space $d_1$ between the first doped regions 208a and the side 210 of the gate 202a and space $d_2$ between the second doped regions 208b and the side 216 of the gate 202a is the same. Also, the first doped regions 208a and the second doped regions 208b have the same width W. In one embodiment, the conductive type of the first doped regions 208a is different from that of the second doped regions 208b. If the first doped regions 208a and the substrate 200 are P-type while the second doped regions 208b are N-type, a ratio of the total area of the first doped regions 208a to the total area of the drain doped region 206 is larger than 0 and smaller than 1.

As shown in FIGS. 1, 2a and 2b, the semiconductor device 500a may further comprise third doped regions 210a and 210b formed in the substrate 200, respectively surrounding the gates 202a and 202b. Also, the third doped regions 210a and 210b respectively surround the source doped regions 204a and 204b. The conductive type of the third doped regions 210a, 210b and the substrate 200 may be a P-type. In one embodiment, the third doped regions 210a and 210b may serve as P-type body regions 210a and 210b, which are used as a channel region and a portion of the source region of a semiconductor device 500a. The semiconductor device 500a may further comprise a fourth doped region 212 formed in the substrate 200, surrounding the drain doped region 206. If the conductive type of the substrate 200 is P-type, the conductive type of the fourth doped region 212 is N-type. In one embodiment, the fourth doped region 212 may serve as an N-type drift region, which is used as a portion of the drain region of a semiconductor device 500a.

Figure 3:
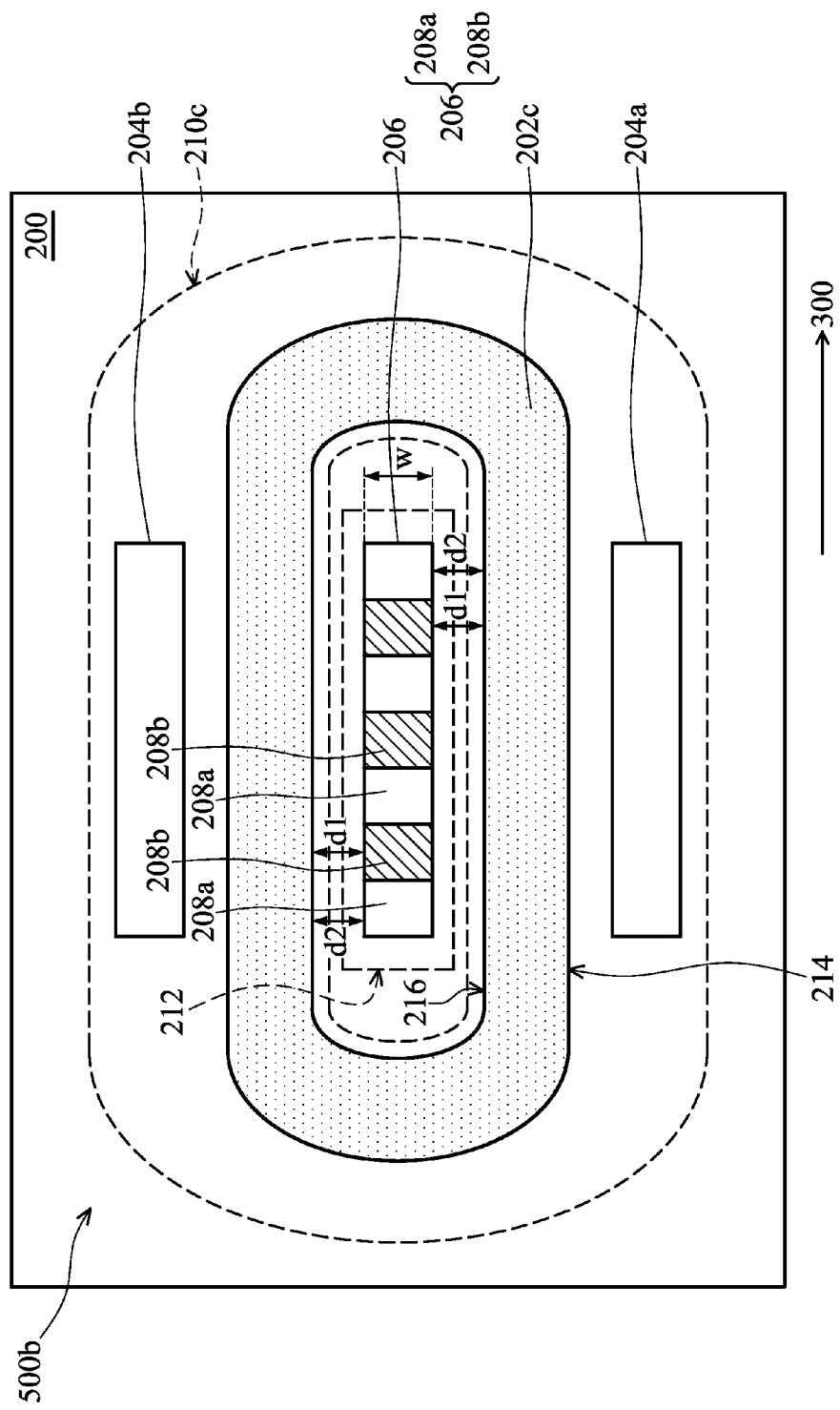
FIG. 3 is a top view showing another exemplary embodiment of the semiconductor device of the invention.

FIG. 3 is a top view showing another exemplary embodiment of the semiconductor device 500b of the invention. In another embodiment, a gate 202c is ring-shaped, and the source doped regions 204a and 204b and the drain doped region 206 are stripe-shaped, wherein the drain doped region 206 is surrounded by the gate 202c. Additionally, a third doped region 210c, which surrounds the source doped regions 204a and 204b and the gate 202c, is also ring-shaped. As shown in FIG. 3, the space $d_1$ between the first doped regions 208a and the side 216 of the gate 202c and space $d_2$ between the second doped regions 208b and the side 216 of the gate 202c are the same. Also, the first doped regions 208a and the second doped regions 208b have the same width W.

FIG. 4 is an equivalent circuit diagram of one exemplary embodiment of the semiconductor device 500a or 500b of the invention. The drain doped region 206 of the semiconductor device 500a or 500b is constructed by a plurality of the first doped regions 208a and a plurality of the second doped regions 208b of different conductive types, wherein the first doped regions 208a and the second doped regions 208b are alternatively arranged along the longitudinal axis direction of the drain doped region 206. In one embodiment, the first doped regions 208a and the second doped regions 208b of the drain doped region 206 may be coupled to a high voltage power supply terminal VDD, and the source doped region 204a may be coupled to a ground terminal GND. As shown in FIG. 4, in one embodiment, if the substrate 200 is P-type, the P-type first doped regions 208a in the fourth doped region 212 (e.g. N-type drift doped region), the N-type second doped regions 208b and the third doped region 210a (e.g. P-type body doped region) may construct a parasitic PNP bipolar transistor (PNP BJT) 410. The P-type first doped regions 208a may serve as an emitter of the parasitic PNP BJT 410. The N-type second doped regions 208b and the fourth doped region 212 (e.g. N-type drift doped region) may serve as a base of the parasitic PNP BJT 410. And the third doped region 210a (e.g. P-type body doped region) may serve as a collector of the parasitic PNP BJT 410. Additionally, the fourth doped region 212 (e.g. N-type drift doped region), the third doped region 210a (e.g. P-type body doped region) and the N-type source doped region 204a may construct a parasitic NPN bipolar transistor (NPN BJT) 420. The fourth doped region 212 (e.g. N-type drift doped region) may serve as an emitter of the parasitic NPN BJT 420. The third doped region 210a (e.g. P-type body doped region) may serve as a base of the parasitic NPN BJT 420. And the N-type source doped region 204a may serve as a collector of the parasitic NPN BJT 420. The parasitic PNP BJT 410 and the parasitic NPN BJT 420 may construct a parasitic silicon controlled rectifier (SCR) 600. If the parasitic SCR 600 encounters ESD current zapping from the high voltage power supply terminal VDD, the parasitic SCR 600 would be triggered and provide a transmission path from the high voltage power supply terminal VDD to the ground terminal GND. Therefore, a high hole injection may be induced from the P-type first doped regions 208a to the P-type substrate 200 through the fourth doped region 212 (e.g. N-type drift doped region). Next, the high hole injection may be injected to the ground terminal GND through the N-type source doped region 204a in the third doped region 210a (e.g. P-type body doped region). Thus, the parasitic SCR 600 would transmit the ESD transient current to the GND and prevent the semiconductor device 500a or 500b from shorting. Additionally, the area ratio of the first doped regions 208a to the second doped regions 208b may be adjusted to modify the holding voltage of the parasitic SCR 600, thereby preventing the semiconductor device 500a or 500b operating in the normal operation voltage from damage because of the triggered SCR 600 results in the latch-up phenomenon during the ESD current zapping. Therefore, the semiconductor device 500a or 500b may integrate an ESD protection device, for example, an SCR, within a drain doped region of a LDMOS without additional masks, processes and chip area requirements.

Table. 1 is an endurance voltage test result of the N-type LDMOS transistors (threshold voltage (Vt): 200V; channel length (L): 0.9 µm; channel width (W): 500 µm) having P-type first doped regions in different areas according to embodiments of the invention and the conventional N-type LDMOS transistor (threshold voltage (Vt): 200V; channel length (L): 0.9 µm; channel width (W): 500 µm) without the P-type first doped regions in human body mode (HBM) (drain is applied the ESD current, source is applied is coupled to GND and the gate is floating).

|  | A ratio of the total area of the P-type first doped regions to the total area of the drain doped region | | | |
|---|---|---|---|---|
|  | 0 (without the P-type doped region) | 0.1 | 0.15 | 0.25 |
| Endurance voltage (kV) | 0.12 | 9.2 | 8.1 | 9.0 |

As shown in Table. 1, the endurance voltage of the conventional N-type LDMOS transistor without the P-type first doped regions is only 0.12 kV in HBM. Therefore, the conventional N-type LDMOS transistor does not have ESD protection function. The N-type LDMOS transistors having P-type first doped regions in different areas according to embodiments of the invention have an average endurance voltage larger than 8 kV, which passes the criterion for ESD in HBM.

The exemplary embodiments of the semiconductor device 500a or 500b of the invention have the following advantages. The drain doped region 206 of the semiconductor device 500a or 500b is constructed by a plurality of the first doped regions 208a and a plurality of the second doped regions 208b of different conductive types, wherein the first doped regions 208a and the second doped regions 208b are alternatively arranged along a longitudinal axis direction of the drain doped region 206. The semiconductor device 500a or 500b may integrate an ESD protection device, for example, an SCR, within a drain doped region of a LDMOS. Therefore, the semiconductor device 500a or 500b may combine functions of the ESD protection device and the LDMOS transistor in the same device without additional masks, processes and chip area requirements. Additionally, the area ratio of the first doped regions 208a to the second doped regions 208b may be adjusted to modify the holding voltage of the parasitic SCR 600, thereby preventing the semiconductor device 500a or 500b operating in the normal operation voltage from damage due to the triggered SCR 600 resulting in the latch-up phenomenon during the ESD current zapping.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a substrate having a first conductive type;
   a gate disposed on the substrate;
   a source doped region formed in the substrate, neighboring with a first side of the gate, wherein the source doped region only has a second conductive type different from the first conductive type; and
   a drain doped region formed in the substrate, neighboring with a second side opposite to the first side of the gate, wherein the drain doped region is constructed by a plurality of first doped regions with the first conductive type and a plurality of second doped regions with the second conductive type, wherein the first doped regions and the second doped regions are alternatively arranged.

2. The semiconductor device as claimed in claim 1, wherein the gate, the source doped region and the drain doped region are stripe-shaped.

3. The semiconductor device as claimed in claim 1, wherein the gate is ring-shaped, and the source doped region and the drain doped region are stripe-shaped.

4. The semiconductor device as claimed in claim 1, wherein the gate, the source doped region and the drain doped region are parallel with each other.

5. The semiconductor device as claimed in claim 1, wherein a plurality of the first doped regions and a plurality of the second doped regions are alternatively arranged along a longitudinal axis direction have the same width.

6. The semiconductor device as claimed in claim 1, wherein spaces between a plurality of the first doped regions and the second side of the gate and spaces between a plurality of the second doped regions and the second side of the gate are the same.

7. The semiconductor device as claimed in claim 1, further comprising:
   a third doped region formed in the substrate, surrounding the gate and the source doped region, wherein the third doped region has the first conductive type; and
   a fourth doped region formed in the substrate, surrounding the drain doped region, wherein the fourth doped region has the second conductive type.

8. The semiconductor device as claimed in claim 1, wherein the first conductive type is P-type and the second conductive type is N-type.

9. The semiconductor device as claimed in claim 8, wherein a ratio of the total area of the first doped regions to the total area of the drain doped region is larger than 0 and smaller than 1.

10. The semiconductor device as claimed in claim 1, wherein the gate and the source doped region are separated by a shallow trench isolation feature.

11. The semiconductor device as claimed in claim 1, wherein the gate and the drain doped region are separated by a shallow trench isolation feature.

12. The semiconductor device as claimed in claim 7, wherein the first doped region, the adjacent second doped region and the third doped region construct a first bipolar transistor.

13. The semiconductor device as claimed in claim 12, wherein the fourth doped region, the third doped region and the source doped region construct a second bipolar transistor.

14. The semiconductor device as claimed in claim 13, wherein the first bipolar transistor and the second bipolar transistor construct a silicon controlled rectifier.

15. A lateral diffused metal-oxide-semiconductor transistor (LDMOS), comprising:
- a P-type substrate;
- a gate disposed on the P-type substrate;
- a source doped region formed in the P-type substrate, neighboring with a first side of the gate, wherein the source doped region is constructed by only one N-type source doped region; and
- a drain doped region formed in the P-type substrate, neighboring with a second side opposite to the first side of the gate, wherein the drain doped region is constructed by a plurality of P-type doped regions and a plurality of N-type doped regions, wherein the P-type doped regions and the N-type doped regions are alternatively arranged.

16. The lateral diffused metal-oxide-semiconductor transistor as claimed in claim 15, wherein the gate, the source doped region and the drain doped region are stripe-shaped.

17. The a lateral diffused metal-oxide-semiconductor transistor as claimed in claim 15, wherein the gate is ring-shaped, and the source doped region and the drain doped region are stripe-shaped.

18. The lateral diffused metal-oxide-semiconductor transistor as claimed in claim 15, wherein the gate, the source doped region and the drain doped region are parallel with each other.

19. The lateral diffused metal-oxide-semiconductor transistor as claimed in claim 15, wherein a plurality of the N-type doped regions and a plurality of the P-type doped regions are alternatively arranged along a longitudinal axis direction having the same width.

20. The lateral diffused metal-oxide-semiconductor transistor as claimed in claim 15, wherein spaces between a plurality of the N-type doped regions and the second side of the gate and spaces between a plurality of the P-type doped regions and the second side of the gate are the same.

21. The lateral diffused metal-oxide-semiconductor transistor as claimed in claim 15, further comprising:
- a P-type body doped region formed in the substrate, surrounding the gate and the source doped region; and
- a N-type drift doped region formed in the substrate, surrounding the drain doped region.

22. The lateral diffused metal-oxide-semiconductor transistor as claimed in claim 15, wherein a ratio of the total area of the P-type doped regions to the total area of the drain doped region is larger than 0 and smaller than 1.

23. The lateral diffused metal-oxide-semiconductor transistor as claimed in claim 15, wherein the gate and the source doped region are separated by a shallow trench isolation feature.

24. The lateral diffused metal-oxide-semiconductor transistor as claimed in claim 15, wherein the gate and the drain doped region are separated by a shallow trench isolation feature.

25. The lateral diffused metal-oxide-semiconductor transistor as claimed in claim 21, wherein the P-type doped region, the adjacent N-type doped region and the P-type body doped region construct a first bipolar transistor.

26. The lateral diffused metal-oxide-semiconductor transistor as claimed in claim 25, wherein the N-type drift doped region, the P-type body doped region and the source doped region construct a second bipolar transistor.

27. The lateral diffused metal-oxide-semiconductor transistor as claimed in claim 26, wherein the first bipolar transistor and the second bipolar transistor construct a silicon controlled rectifier.

* * * * *